(12) United States Patent
Wu

(10) Patent No.: US 11,437,599 B2
(45) Date of Patent: Sep. 6, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Shaojing Wu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 256 days.

(21) Appl. No.: 16/637,803

(22) PCT Filed: Oct. 23, 2019

(86) PCT No.: PCT/CN2019/112810
§ 371 (c)(1),
(2) Date: Feb. 10, 2020

(87) PCT Pub. No.: WO2021/031331
PCT Pub. Date: Feb. 25, 2021

(65) Prior Publication Data
US 2021/0057672 A1 Feb. 25, 2021

(30) Foreign Application Priority Data
Aug. 19, 2019 (CN) .......................... 201910764743.9

(51) Int. Cl.
*H01L 51/52* (2006.01)

(52) U.S. Cl.
CPC .... *H01L 51/5237* (2013.01); *H01L 2251/301* (2013.01); *H01L 2251/56* (2013.01)

(58) Field of Classification Search
None
See application file for complete search history.

(56) References Cited

U.S. PATENT DOCUMENTS

| 2017/0288166 | A1 | 10/2017 | Kim |
| 2017/0352832 | A1 | 12/2017 | Okamoto et al. |
| 2019/0280246 | A1* | 9/2019 | Cheng ................. H01L 51/5246 |
| 2020/0013971 | A1* | 1/2020 | Park .................... H01L 27/3244 |
| 2020/0357345 | A1* | 11/2020 | Cho .................... H01L 27/3246 |
| 2020/0388784 | A1* | 12/2020 | Kim .................... H01L 27/3276 |

FOREIGN PATENT DOCUMENTS

| CN | 207116481 U | 3/2018 | |
| CN | 108122502 A * | 6/2018 | ........... G06F 1/1616 |

* cited by examiner

*Primary Examiner* — Evren Seven
(74) *Attorney, Agent, or Firm* — The Roy Gross Law Firm, LLC; Roy Gross

(57) ABSTRACT

The present disclosure provides a display panel and a display device. The display panel includes a substrate, including a display area and a non-display area; a display functional layer disposed on the display area; a plurality of protruding blocks disposed on the non-display area; and an encapsulation layer disposed on the display functional layer; wherein the encapsulation layer extends along an edge of the display functional layer to the non-display area and covers the plurality of protruding blocks.

9 Claims, 4 Drawing Sheets

DISPLAY PANEL AND DISPLAY DEVICE

FIELD OF INVENTION

The present disclosure relates to the field of display technologies, and more particularly, to a display panel and a display device.

BACKGROUND OF INVENTION

Organic light emitting diodes (OLEDs) are a current-type light emitting device, which have received widespread attention due to advantages of self-illumination, rich color, fast response times, wide viewing angles, light weight, and ability to be made into flexible displays, etc.

However, OLED display panels are prone to a problem of breakage during bending process or falling off encapsulation layer and underlying film layer, leading to failure of the OLED display panels and thereby reducing product yield.

SUMMARY OF INVENTION

The technical problems mainly solved by the present disclosure are that the display panels are prone to occur the problem that breakage during the bending process or falling off the encapsulation layer and the underlying film layer.

In first aspect, the present disclosure provides a display panel, including: a substrate comprising a display area and a non-display area;

a display functional layer being disposed on the display area;

a plurality of protruding blocks being disposed on the non-display area; and an encapsulation layer being disposed on the display functional layer, wherein the encapsulation layer extends along an edge of the display functional layer to the non-display area and covers the plurality of protruding blocks;

wherein the encapsulation layer comprises a first inorganic layer, an organic layer, and a second inorganic layer disposed on the display functional layer in sequence;

wherein a retaining wall is disposed on an edge region of the first inorganic layer, the organic layer is disposed on the first inorganic layer, and the organic layer is blocked in the retaining wall, the organic layer is provided with the second inorganic layer covering the first inorganic layer, the organic layer, and the retaining wall, and the first inorganic layer and the second inorganic layer extend along an edge of the display functional layer to the non-display area and cover the plurality of protruding blocks; and wherein surfaces of the plurality of protruding blocks toward the encapsulation layer each have a roughened structure.

In the display panel of the present disclosure, the plurality of the protruding blocks are spaced apart, a gap is formed between adjacent protruding blocks, and the first inorganic layer and the second inorganic layer extend along the edge of the display functional layer to the non-display area and cover a plurality of the protruding blocks and a plurality of the gaps.

In the display panel of the present disclosure, each of the protruding blocks comprises a first side wall and a second side wall oppositely disposed, and a third side wall and a fourth side wall disposed respectively at two sides of the first side wall, and the third side wall and the fourth side wall are oppositely disposed;

wherein the first side wall is disposed on the substrate, and the first inorganic layer and the second inorganic layer are disposed along the second side wall, the third side wall, and the fourth side wall.

In the display panel of the present disclosure, the plurality of protruding blocks are arranged in an array.

In the display panel of the present disclosure, the plurality of protruding blocks comprise a plurality of first protruding blocks and a plurality of second protruding blocks;

wherein the plurality of first protruding blocks are arranged at intervals, and each of the plurality of second protruding blocks is correspondingly disposed between adjacent ones of the first protruding blocks.

In the display panel of the present disclosure, a distance between the adjacent ones of first protruding blocks is equal to a distance between the adjacent ones of second protruding blocks.

In the display panel of the present disclosure, a distance between the adjacent ones of first protruding blocks is greater than a distance between the adjacent ones of second protruding blocks.

In the display panel of the present disclosure, the substrate comprises a first horizontal section, a second horizontal section, and a bending section disposed between the first horizontal section and the second horizontal section, the display area comprises a first display area, a second display area, and a bent display area, and the non-display area comprises a first bending area, a second bending area, and a non-bending area;

wherein the first display area is located on the first horizontal section, the second display area is located on the second horizontal section, and the bent display area is located at a center of the bending section, the first bending area and the second bending area are both located on the bending section and are disposed on opposite sides of the bent display area, and the non-bending area is disposed at a periphery of the first display area and the second display area, and the plurality of protruding blocks are respectively disposed on the first bending area and the second bending area.

In second aspect, the present disclosure provides a display panel, including: a substrate including a display area and a non-display area;

a display functional layer being disposed on the display area;

a plurality of protruding blocks being disposed on the non-display area; and an encapsulation layer being disposed on the display functional layer, wherein the encapsulation layer extends along an edge of the display functional layer to the non-display area and covers the plurality of protruding blocks.

In the display panel of the present disclosure, the encapsulation layer comprises a first inorganic layer, an organic layer, and a second inorganic layer disposed on the display functional layer in sequence;

wherein a retaining wall is disposed on an edge region of the first inorganic layer, the organic layer is disposed on the first inorganic layer, and the organic layer is blocked in the retaining wall, the organic layer is provided with the second inorganic layer covering the first inorganic layer, the organic layer, and the retaining wall, and the first inorganic layer and the second inorganic layer extend along an edge of the display functional layer to the non-display area and cover the plurality of protruding blocks.

In the display panel of the present disclosure, the plurality of the protruding blocks are spaced apart, a gap is formed between adjacent protruding blocks, and the first inorganic layer and the second inorganic layer extend along the edge of the display functional layer to the non-display area and cover a plurality of the protruding blocks and a plurality of the gaps.

In the display panel of the present disclosure, each of the protruding blocks comprises a first side wall and a second side wall oppositely disposed, and a third side wall and a fourth side wall disposed respectively at two sides of the first side wall, and the third side wall and the fourth side wall are oppositely disposed;

wherein the first side wall is disposed on the substrate, and the first inorganic layer and the second inorganic layer are disposed along the second side wall, the third side wall, and the fourth side wall.

In the display panel of the present disclosure, the plurality of protruding blocks are arranged in an array.

In the display panel of the present disclosure, the plurality of protruding blocks comprise a plurality of first protruding blocks and a plurality of second protruding blocks;

wherein the plurality of first protruding blocks are arranged at intervals, and each of the plurality of second protruding blocks is correspondingly disposed between adjacent ones of the first protruding blocks.

In the display panel of the present disclosure, a distance between the adjacent ones of first protruding blocks is equal to a distance between the adjacent ones of second protruding blocks.

In the display panel of the present disclosure, a distance between the adjacent ones of first protruding blocks is greater than a distance between the adjacent ones of second protruding blocks.

In the display panel of the present disclosure, surfaces of the plurality of protruding blocks toward the encapsulation layer each have a roughened structure.

In the display panel of the present disclosure, the substrate includes a first horizontal section, a second horizontal section, and a bending section disposed between the first horizontal section and the second horizontal section, the display area comprises a first display area, a second display area, and a bent display area, and the non-display area comprises a first bending area, a second bending area, and a non-bending area;

wherein the first display area is located on the first horizontal section, the second display area is located on the second horizontal section, and the bent display area is located at a center of the bending section, the first bending area and the second bending area are both located on the bending section and are disposed on opposite sides of the bent display area, and the non-bending area is disposed at a periphery of the first display area and the second display area, and the plurality of protruding blocks are respectively disposed on the first bending area and the second bending area.

In the third aspect, the present disclosure provides a display device, including a display panel, the display panel including: a substrate comprising a display area and a non-display area;

a display functional layer being disposed on the display area;

a plurality of protruding blocks being disposed on the non-display area; and an encapsulation layer being disposed on the display functional layer, wherein the encapsulation layer extends along an edge of the display functional layer to the non-display area and covers the plurality of protruding blocks.

The beneficial effect of the present disclosure is that by disposing a plurality of protruding blocks on the non-display area of the substrate to increase the contact area between the substrate and the encapsulation layer, when bending the display panel, the plurality of protruding blocks can absorb part of the stress, thereby solving the problem of the display panels being prone to breakage during the bending process or having the encapsulation layer and the underlying film layer fall off, and thereby improving the product yield.

DESCRIPTION OF DRAWINGS

To more clearly illustrate the embodiments of the present disclosure or the technical solutions in the prior art, the figures used in the embodiments of the present disclosure or the description of the prior art will be briefly described below. Obviously, the figures in the following description are only for some embodiments of the present disclosure, and those of ordinary skill in the art may also obtain other figures according to these figures without inventive steps.

DETAILED DESCRIPTION OF PREFERRED EMBODIMENTS

Figure 1:
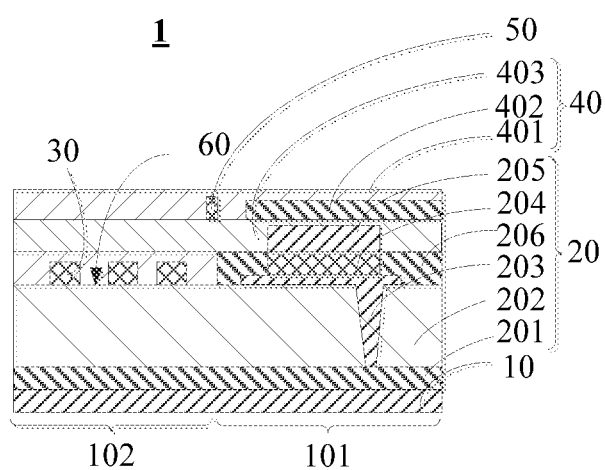
FIG. 1 is a schematic structural diagram of a display panel according to a first embodiment of the present disclosure.

The embodiments of the present disclosure are described in detail below, and the embodiments are illustrated in the figures, wherein the same or similar reference numerals are used to refer to the same or similar elements or elements having the same or similar functions. The embodiments described below regarding the accompanying figures are intended to be illustrative and are not to be construed as limiting the present disclosure.

Please refer to FIG. 1, FIG. 1 is a schematic structural diagram of a display panel according to a first embodiment of the present disclosure.

The present disclosure provides a display panel 1, including a substrate 10, a display functional layer 20, a plurality of protruding blocks 30, and an encapsulation layer 40. The substrate 10 includes a display area 101 and a non-display area 102, the display functional layer 20 is disposed on the display area 101, the plurality of protruding blocks 30 is disposed on the non-display area 102, and the encapsulation layer 40 is disposed on the display functional layer 20, wherein the encapsulation layer 40 extends along an edge of the display functional layer 20 to the non-display area 102 and covers the plurality of protruding blocks 30.

The substrate 10 can be a flexible substrate including the display area 101 and the non-display area 102. The display functional layer 20 may be disposed on the display area 101, and the plurality of protruding blocks 30 may be disposed on the non-display area 102. The encapsulation layer 40 is disposed on the display functional layer 20, and is used for preventing the display functional layer 20 from being invaded by water and oxygen, thereby causing the display functional layer 20 to fail. Moreover, the encapsulation layer 40 extends along an edge of the display functional layer 20 to the non-display area 102 and covers the plurality of protruding blocks 30. A material of the protruding blocks 30 may be an organic polymer material for buffering stress and coating foreign matter of the substrate during bending and folding. For example, the material of the protruding blocks 30 may be acrylic, epoxy, or silicone. The display functional layer 20 may include a thin film transistor layer 201, a planarization layer 202, an anode layer 203, an emission layer 204, a cathode layer 205, and a pixel definition layer 206, as shown in FIG. 1.

The present disclosure increases the contact area between the substrate 10 and the encapsulation layer 40 by providing the plurality of protruding blocks 30 on the non-display area 102 of the substrate 10.

Furthermore, please continue referring to FIG. 1, the encapsulation layer 40 includes a first inorganic layer 401, an organic layer 402, and a second inorganic layer 403 disposed on the display functional layer 20 in sequence. A retaining wall 50 is disposed on an edge region of the first inorganic layer 401, the organic layer 402 is disposed on the first inorganic layer 401 and the organic layer 402 is blocked in the retaining wall 50, the organic layer 402 is provided with the second inorganic layer 403 covering the first inorganic layer 401, the organic layer 402, and the retaining wall 50, and the first inorganic layer 401 and the second inorganic layer 403 extend along an edge of the display functional layer 20 to the non-display area 102 and cover the plurality of protruding blocks 30.

A material of the first inorganic layer 401 may be silicon nitride, silicon oxide, or silicon carbonitride. A material of the second inorganic layer 403 may also be silicon nitride, silicon oxide, or silicon carbonitride. In some embodiments, the material of the first inorganic layer 401 may be consistent with the material of the second inorganic layer 403. For example, the material of the first inorganic layer 401 and the material of the second inorganic layer 403 are both silicon nitride. Of course, the material of the first inorganic layer 401 and the material of the second inorganic layer 403 may also be different, and are specifically set according to actual conditions, and details are not described herein again.

An inorganic retaining wall 50 is disposed on the edge region of the first inorganic layer 401. The inorganic retaining wall 50 can further improve the ability of the display panel 1 to resist water and oxygen, and in the actual manufacturing process, can prevent an overflow of the organic layer 402 and the occurrence of package failure.

In some embodiment, the plurality of the protruding blocks 30 are spaced apart, a gap 60 is formed between adjacent ones of protruding blocks 30, and the first inorganic layer 401 and the second inorganic layer 403 extend along the edge of the display functional layer 20 to the non-display area 102 and cover the plurality of protruding blocks 30 and the plurality of gaps 60.

Figure 2:
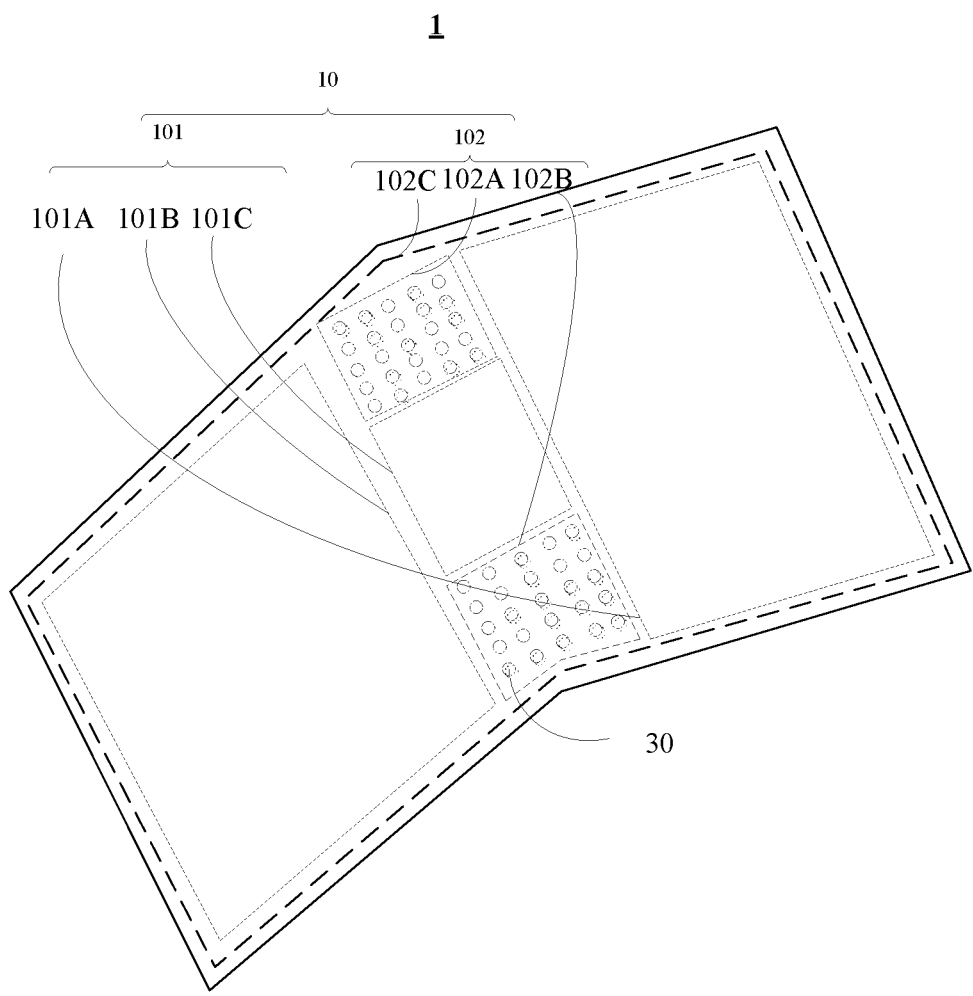
FIG. 2 is a schematic stereogram of the display panel according to the first embodiment of the present disclosure.

In some embodiment, please refer to FIG. 1 and FIG. 2. FIG. 2 is a schematic stereogram of a display panel according to the first embodiment of the present disclosure. The substrate 10 includes a first horizontal section, a second horizontal section, and a bending section disposed between the first horizontal section and the second horizontal section, the display area 101 includes a first display area 101A, a second display area 101B, and a bent display area 101C, and the non-display area 102 includes a first bending area 102A, a second bending area 102B, and a non-bending area 102C. The first display area 101A is located on the first horizontal section, the second display area 101B is located on the second horizontal section, and the bent display area 101C is located at a center of the bending section, the first bending area 102A and the second bending area 102B are both located on the bending section and are disposed on opposite sides of the bent display area, and the non-bending area 102C is disposed at a periphery of the first display area 101A and the second display area 101B, and the plurality of protruding blocks 30 are respectively disposed on the first bending area 102A and the second bending area 102B.

When bending the display panel 1, the plurality of protruding blocks 30 respectively disposed on the first bending area 102A and on the second bending area 102B can absorb part of the stress, thereby solving the problem of the display panel 1 being prone to breakage during the bending process or having the encapsulation layer 30 and the underlying film layer fall off, thereby improving the product yield.

In some embodiments, the plurality of protruding blocks 30 are arranged in an array, which, as shown in FIG. 2, facilitates the design of the display panel 1 and improves the production efficiency of the display panel 1.

Figure 3:
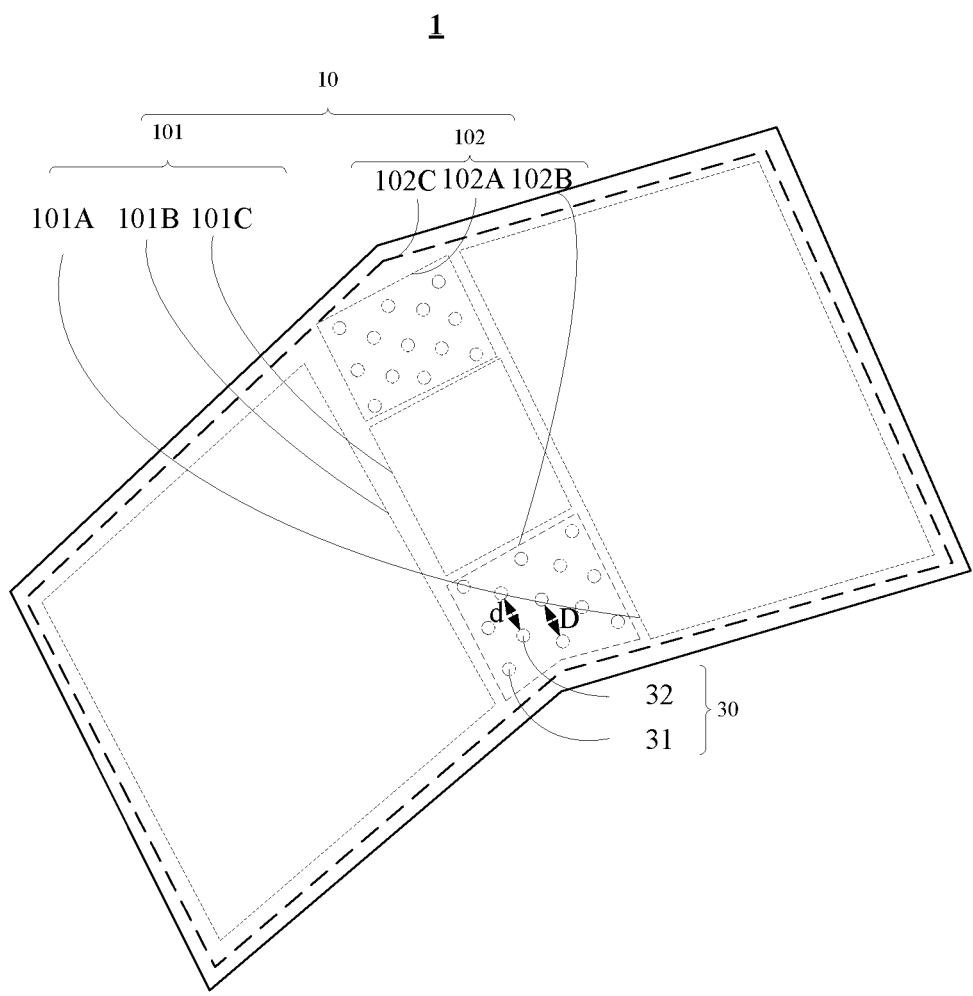
FIG. 3 is a schematic stereogram of a display panel according to a second embodiment of the present disclosure.

In some embodiments, please refer to FIG. 3, FIG. 3 is a schematic stereogram of a display panel according to a second embodiment of the present disclosure. The present disclosure further provides a display panel 1, the difference between the display panel 1 of FIG. 3 and the display panel 1 of FIG. 2 is that a plurality of protruding blocks 30 include a plurality of first protruding blocks 31 and a plurality of second protruding blocks 32.

The plurality of first protruding blocks 31 are arranged at intervals, and each of the plurality of second protruding blocks 32 is correspondingly disposed between adjacent ones of the first protruding blocks 31. By disposing the plurality of second protruding blocks 32 correspondingly disposed between the adjacent ones of the first protruding blocks 31, when bending the display panel 1, the plurality of first protruding blocks 31 and the plurality of second protruding blocks 32 can absorb part of the stress, therefore improving the bending features of the display panel 1, and extending the path in which water and oxygen invade the display functional layer 20 from the non-display area 102, thereby improving the water and oxygen resistance of the display panel 1.

In some embodiment, a distance D between the adjacent ones of first protruding blocks 31 is equal to a distance between the adjacent ones of second protruding blocks 32. As shown in FIG. 3, when bending the display panel 1, the stress absorbed by each of the first protruding blocks 31 is equal to the stress absorbed by each of the second protruding blocks 32. Therefore, this will not lead to part of the first protruding blocks 31 absorbing more stress or part of the second protruding blocks 32 absorbing more stress, and will also not lead to the first protruding blocks 31 falling off from the first inorganic layer 401 or the second protruding blocks 32 falling off from the first inorganic layer 401.

In some embodiment, the distance D between the adjacent ones of first protruding blocks 31 is greater than the distance d between the adjacent ones of second protruding blocks 32. When bending the display panel 1, the stress absorbed by each of the first protruding blocks 31 is greater than the stress absorbed by each of the second protruding blocks 32. Therefore, it can be understood that a size of the second protruding blocks 32 is greater than a size of the first protruding blocks 31. Furthermore, the distance D between the adjacent ones of first protruding blocks 31 is greater than the distance d between the adjacent ones of second protruding blocks 32, extending the path in which water and oxygen invade the display functional layer 20 from the non-display area 102, thereby improving the water and oxygen resistance of the display panel 1.

Figure 4:
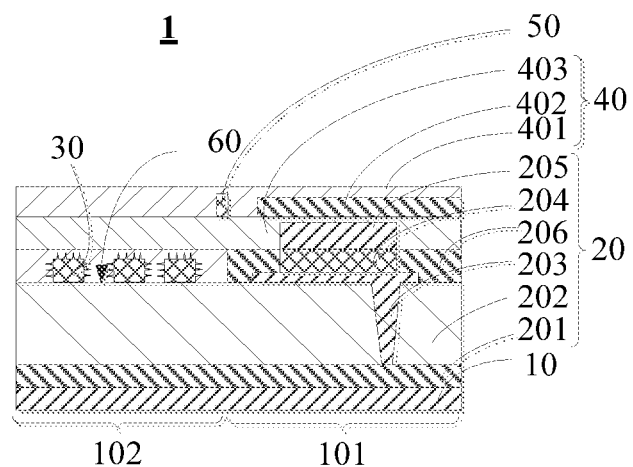
FIG. 4 is a schematic structural diagram of the display panel according to the second embodiment of the present disclosure.

In some embodiments, surfaces of the plurality of protruding blocks 30 toward the encapsulation layer 40 each have a roughened structure, as shown in FIG. 4. For example, the surface of the protruding blocks 30 toward the encapsulation layer 40 may be disposed in a zigzag structure to increase an area in which the protruding blocks 30 contacts the encapsulation layer 40, and to prevent the encapsulation layer 40 from falling off from the substrate 10.

Figure 5:
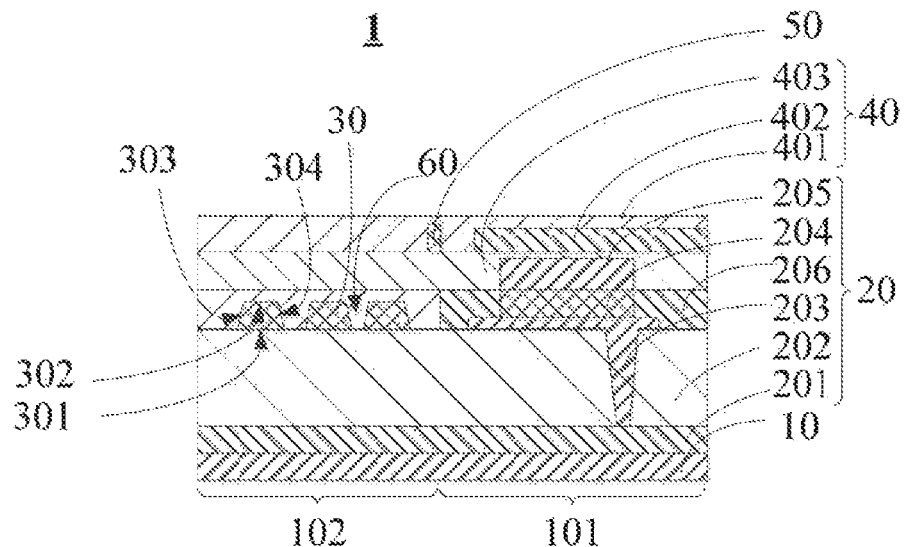
FIG. 5 is a schematic structural diagram of a display panel according to a third embodiment of the present disclosure.

In some embodiment, please refer to FIG. 5, FIG. 5 is a schematic structural diagram of a display panel according to a third embodiment of the present disclosure. The difference between the display panel 1 of FIG. 5 and the display panel 1 of FIG. 1 is that each of the protruding blocks 30 comprises a first side wall 301 and a second side wall 302 oppositely disposed, and a third side wall 303 and a fourth side wall 304 disposed respectively at two sides of the first side wall 301, wherein the third side wall 303 and the fourth side wall 304 are oppositely disposed.

The first side wall 301 is disposed on the substrate 10, and the first inorganic layer 401 and the second inorganic layer 403 are disposed along the second side wall 302, the third side wall 303, and the fourth side wall 304. In actual manufacturing, after forming the display functional layer 20 on the display area 101 and forming the plurality of protruding blocks on the non-display area 102, forming the first inorganic layer 401 on the display functional layer 20. The first inorganic layer 401 extend along an edge of the display functional layer 20 to the non-display area 102, and covers the plurality of protruding blocks 30 and the plurality of intervals 60. The first inorganic layer 401 can be manufactured on the display functional layer 20 by a process of chemical vapor deposition. Then, using a mask, an inorganic retaining wall 50 is manufactured on an edge region of the first inorganic layer 401 by a chemical vapor deposition process. A method of disposing the organic layer 402 on the first inorganic layer 401 can be that of printing the organic layer 402 on an inner side of the inorganic retaining wall 50 by an inkjet printing process. Next, manufacturing the second inorganic layer 403 covering the first inorganic layer 401, the organic layer 402, and the inorganic barrier 50 on the organic layer 402. It should be noted that only the second inorganic layer 403 is disposed on the first inorganic layer 401 of the non-display area 102.

In some embodiments, please continue to refer the FIG. 5, the protruding blocks 30 can be provided in a trapezoidal structure. Therefore, it can be understood that an angle between the first side wall 301 and the third side wall 303 is an acute angle, and an angle between the first side wall 301 and the fourth side wall 304 is also an acute angle.

In the present disclosure, by disposing the plurality of protruding blocks 30 on the non-display area 102 of the substrate 10 to increase the contact area between the substrate 10 and the encapsulation layer 40, when bending the display panel 1, the plurality of protruding blocks 30 can absorb part of the stress, thereby solving the problem of the display panel 1 being prone to breakage during the bending process or having the encapsulation layer 40 and the underlying film layer fall off, thereby improving the product yield.

The present disclosure further provides a display device, including the display panel 1 provided by any embodiment of the present disclosure. Please refer to the previous embodiment for details, and details are not described herein again.

The display panel and the display device provided by the embodiments of the present disclosure are described in detail. The principles and implementations of the present disclosure are described in the previous embodiment. The description of the above embodiments is only for helping to understand the present disclosure. Further, those skilled in the art will be able to change the specific embodiments and the scope of the disclosure according to the idea of the present disclosure. In the above, the content of the specification should not be construed as limiting the present disclosure.

What is claimed is:

1. A display panel, comprising:
   a substrate comprising a display area and a non-display area;
   a display functional layer disposed on the display area;
   a plurality of protruding blocks disposed on the non-display area; and
   an encapsulation layer disposed on the display functional layer, wherein the encapsulation layer extends along an edge of the display functional layer to the non-display area and covers the plurality of protruding blocks;
   wherein surfaces of the plurality of protruding blocks toward the encapsulation layer all have a roughened structure.

2. The display panel as claimed in claim 1, wherein the encapsulation layer comprises a first inorganic layer, an organic layer, and a second inorganic layer disposed on the display functional layer in sequence;
   wherein a retaining wall is disposed on an edge region of the first inorganic layer, the organic layer is disposed on the first inorganic layer, the organic layer is blocked in the retaining wall, the organic layer is provided with the second inorganic layer covering the first inorganic layer, the organic layer, and the retaining wall, and the first inorganic layer and the second inorganic layer extend along the edge of the display functional layer to the non-display area and cover the plurality of protruding blocks.

3. The display panel as claimed in claim 2, wherein the plurality of protruding blocks are spaced apart, a gap is formed between adjacent protruding blocks, and the first inorganic layer and the second inorganic layer extend along the edge of the display functional layer to the non-display area and cover the plurality of protruding blocks and a plurality of gaps.

4. The display panel as claimed in claim 3, wherein each of the protruding blocks comprises a first side wall and a second side wall oppositely disposed, a third side wall and a fourth side wall disposed respectively at two sides of the first side wall, and the third side wall and the fourth side wall are oppositely disposed; and
   wherein the first side wall is disposed on the substrate, and the first inorganic layer and the second inorganic layer are disposed along the second side wall, the third side wall, and the fourth side wall.

5. The display panel as claimed in claim 4, wherein the plurality of protruding blocks are arranged in an array.

6. The display panel as claimed in claim 4, wherein the plurality of protruding blocks comprise a plurality of first protruding blocks and a plurality of second protruding blocks;
   wherein the plurality of first protruding blocks are arranged at intervals, and each of the plurality of second protruding blocks is correspondingly disposed between adjacent ones of the first protruding blocks.

7. The display panel as claimed in claim 6, wherein a distance between the adjacent ones of first protruding blocks is equal to a distance between the adjacent ones of second protruding blocks.

8. The display panel as claimed in claim 6, wherein a distance between the adjacent ones of first protruding blocks is greater than a distance between the adjacent ones of second protruding blocks.

9. The display panel as claimed in claim 1, wherein the substrate comprises a first horizontal section, a second horizontal section, and a bending section disposed between the first horizontal section and the second horizontal section, the display area comprises a first display area, a second display area, and a bent display area, and the non-display area comprises a first bending area, a second bending area, and a non-bending area;

wherein the first display area is located on the first horizontal section, the second display area is located on the second horizontal section, the bent display area is located at a center of the bending section, the first bending area and the second bending area are both located on the bending section and are disposed on opposite sides of the bent display area, the non-bending area is disposed at a periphery of the first display area and the second display area, and the plurality of protruding blocks are respectively disposed on the first bending area and the second bending area.

\* \* \* \* \*